United States Patent [19]
Presentey

[11] 3,947,843
[45] Mar. 30, 1976

[54] ARRANGEMENT FOR PREVENTING AMBIGUITY IN DIGITAL DISPLACEMENT MEASURING APPARATUS

[76] Inventor: Shelley M. Presentey, 1268 Henry Farm Drive, Ottawa K2C2E2, Canada

[22] Filed: Mar. 30, 1973

[21] Appl. No.: 346,702

[30] Foreign Application Priority Data
Feb. 5, 1973 Canada.................................. 162851

[52] U.S. Cl. 340/347 P; 340/173 LT; 235/61.11 E; 307/238; 328/151
[51] Int. Cl.² ........................................ H03K 13/00
[58] Field of Search........ 33/125 C, 1 N, 1 PT, 1 A, 33/1 T, 1 L; 340/347 P, 173 LT, 347 AD; 235/61.11 E, 61.6 E; 307/238; 328/151

[56] References Cited
UNITED STATES PATENTS

| | | | |
|---|---|---|---|
| 2,796,598 | 6/1957 | Cartwright....................... | 340/347 P |
| 2,899,673 | 8/1959 | Reiner............................ | 340/347 P |
| 3,454,943 | 7/1969 | Brown............................ | 340/347 DA |
| 3,502,850 | 3/1970 | Lindquist et al. ............. | 235/61.11 E |
| 3,510,683 | 5/1970 | Rotier............................ | 307/229 X |
| 3,588,452 | 6/1971 | Kee................................ | 235/61.11 E |
| 3,594,735 | 7/1971 | Furlong et al................. | 340/347 AD |
| 3,594,764 | 7/1971 | Walsh............................ | 340/347 P |
| 3,641,564 | 2/1972 | Fassett et al. .................... | 340/347 P |
| 3,758,752 | 11/1973 | Kapsambelis et al. .... | 340/146.3 K X |

Primary Examiner—Thomas J. Sloyan
Attorney, Agent, or Firm—Michael S. Striker

[57] ABSTRACT

The displacement of a first element relative to a second element in a predetermined direction is measured by a code display which has sets of code markings, each set representing a predetermined unit of displacement, spaced at predetermined distances from each other in said predetermined direction. The code display also has control markings each of which indicates the center of the set of code markings taken in the predetermined direction. Transducers sense the code markings and the control markings and furnish, respectively, corresponding data and control signals. An output circuit furnishes output signals corresponding to the data signals only upon simultaneous receipt of the control signals and the data signals, thereby assuring that the read-out means are substantially at the center of the code markings during read-out. The output signals may be stored until receipt of the next subsequent control signal.

15 Claims, 11 Drawing Figures

ARRANGEMENT FOR PREVENTING AMBIGUITY IN DIGITAL DISPLACEMENT MEASURING APPARATUS

BACKGROUND OF THE INVENTION

The present invention relates to equipment capable of measuring linear, angular, or combined linear and angular displacement. In particular, it relates to such devices which are operated on a digital basis and wherein the magnitude of such displacement is directly displayed or recorded in a prearranged digital code through suitable read-out and output means. The need for such systems, and in particular for such systems wherein the read-out is carried out without possibility of ambiguity and in a reliable manner, is very wide. A particular field of application to be discussed herein is the field of aerial and photogrammetry and of the taking of forest inventories. The system is, of course, in no respect limited to these applications.

As regards the taking of forest inventories, it has been found that the efficiency of such inventories can be increased by minimizing the tedious and expensive ground work required to correlate photo and ground estimates. Current research, therefore, is aimed at developing methods which will increase the reliability of photogrammetric measurements and estimates of tree characteristics. One technique which is becoming established is forest sampling by air photography from low altitudes (typically at scales between 1:1000 and 1:3000), which provides sufficient detail for accurate photo measurements of tree height and tree-crown dimensions which permit the estimation of tree diameter, volume and other statistics. But the conversion of these measurements to actual values requires exact knowledge of the photographic scale. Conventional methods based on ground controls are inefficient.

A radar altimeter has been developed which is capable of measuring distance between aircraft and the ground with a precision of ±1 percent, regardless of intervening vegetation. This continuous measurement is recorded on each photographic frame through the secondary optics of the camera. From the aircraft-to-ground distance and the focal length of the camera, the true dimensional relationship between the object and its image can be computed, provided the camera was vertical at the time of the exposure. Unfortunately, this is seldom the case and serious errors can be introduced by tilt. For example, when using small format (70mm) cameras and lenses of long focal length, a longitudinal tilt difference of only one degree between successive frames might cause a base deformation and height error of more than 20 percent. To overcome this difficulty, an airborne gyrostabilizer system can be used to continuously measure and record aircraft pitch and roll angles and the corresponding angles on the aerial camera which is rigidly mounted to the airframe. The longitudinal and lateral tilt angles measured at the gimbals of the gyroscope are recorded on each photographic frame through the secondary optics of the camera. Thus, the angles at which each exposure was made are immediately known. With the system of the present invention wherein a lack of ambiguity in the read-out is accomplished even at very high resolution, the required degree of accuracy of the tree measurements mentioned above can readily be achieved.

The present invention can, of course, find application also in conjunction with airborne gyrostabilizer systems wherein it is merely required to furnish an indication of the longitudinal and lateral tilt angles to the pilot. In this case, these angles are not recorded by a camera, but are displayed directly for the pilot's information.

SUMMARY OF THE INVENTION

The present invention comprises displacement measuring apparatus for measuring displacement in a predetermined direction of a first element relative to a second element. It comprises code display means coupled to said first element, said code display means having digital code markings representing predetermined units of displacement, spaced at predetermined intervals from each other in said predetermined direction. It further comprises control markings on said code display means, said control markings being arranged in predetermined positions relative to said code markings. The invention further comprises read-out means including at least one code read-out means and one control read-out means for reading, respectively, code markings and control markings passing in operative proximity thereto and furnishing corresponding data and control signals. The invention further comprises output circuit means connected to said read-out means for furnishing output signals corresponding to said data signals only upon receipt of said control signals, whereby said output signals are furnished only when said read-out means is in predetermined positions relative to said code markings.

More specifically, when said code markings are arranged side-by-side, each of said control markings are positioned relative to said code markings in such a manner that said control markings indicate the center of said code markings in said predetermined direction. In this way, the output signals are furnished only when the read-out means are substantially in the center of the code markings in the displacement direction, thereby preventing ambiguities which might occur when the read-out means are in a position wherein two code markings may be overlapped or wherein slight oscillations might cause a change from one code marking to the next.

It should be noted that the term "center" in the present application is used in a broad sense for indicating any position along said width of said code markings where no read-out ambiguity can occur. It thus includes, but is not limited to, the geometric center of the code markings in said predetermined position.

In a preferred embodiment of the present invention, the output signals furnished at the occurrences of one control signal are stored and continue to be displayed until receipt of the next subsequent control signal.

The novel features which are considered as characteristic for the invention are set forth in particular in the appended claims. The invention itself, however, both as to its construction and its method of operation, together with additional objects and advantages thereof, will be best understood from the following description of specific embodiments when read in connection with the accompanying drawing.

BRIEF DESCRIPTION OF THE DRAWING

FIG. 5b shows waveforms at various points of the circuit of FIG. 5a.

DESCRIPTION OF THE PREFERRED EMBODIMENTS

A preferred embodiment of the present invention will now be described with reference to the drawings.

Figure 1:
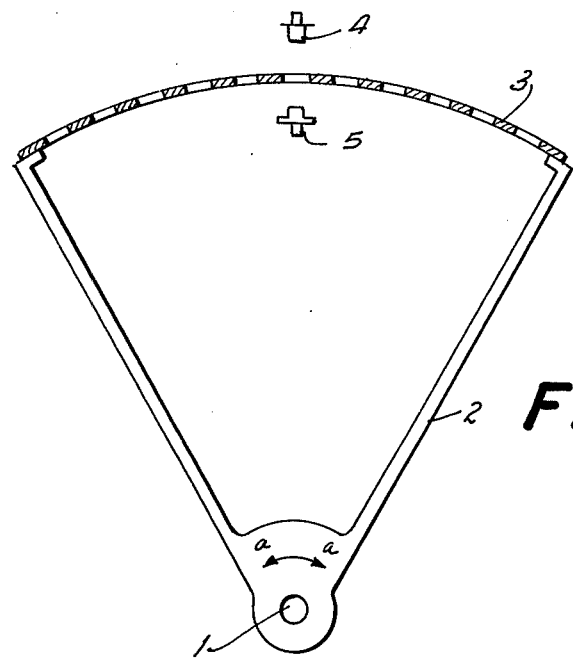
FIG. 1 shows the code display means of the present invention mounted for measurement of angular displacement.

In FIG. 1, an arrangement for measuring angular displacement is shown. Shaft 1 rotates in direction a—a. Attached to shaft 1 is an armature 2 which at its rim is fitted with the code display means, here a perforated or otherwise encoded screen 3 suitably curved in a circular curve concentric with the axis of shaft 1.

The embodiment shown in FIG. 1 is a photoelectric embodiment, which is a preferred embodiment of the present invention. For this embodiment a light source, here a light-emitting diode 4, is placed on one side of a screen and a photosensor, here a phototransistor 5, is placed on the other side. As shaft 1 rotates, the angular position of armature 2 changes accordingly and, if the angular change is sufficient, the light beam emitted by diode 4 will be interrupted, causing a change in the light impinging upon phototransistor 5, thereby changing the output of said phototransistor. Thus the angular rotation of the shaft is digitized in a sequence of pulses which, in the simplest case, may be counted to constitute a measure of the total angular displacement.

Figure 2A:
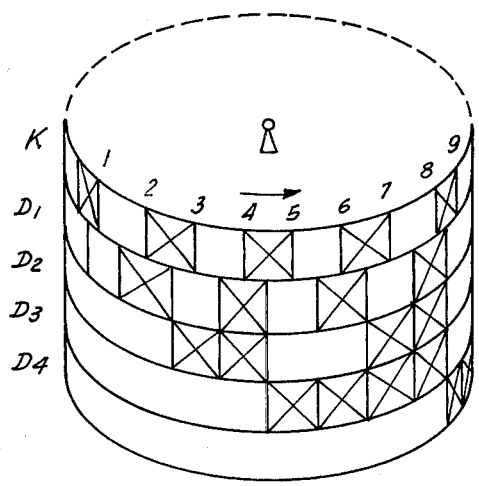
FIGS. 2a, 2b and 2c show preferred embodiments of code display means including control markings.
Figure 2B:
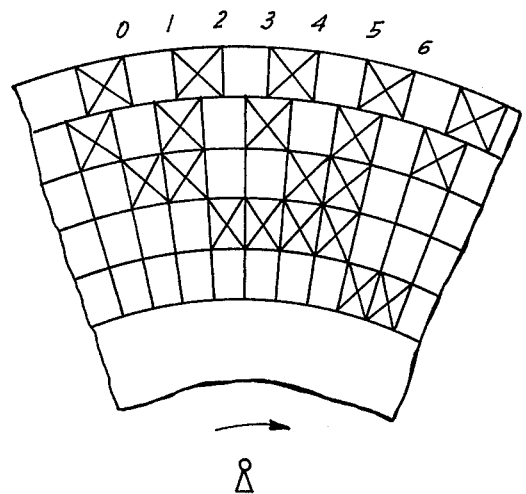
Figure 2C:
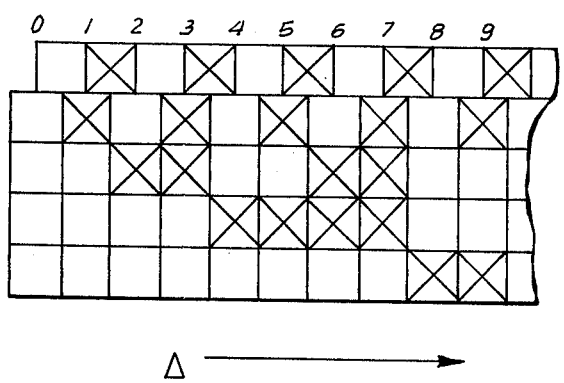

Arrangements using the single pulse line described are known. However, the arrangement of FIG. 1 may utilize code display means according to the present invention such as shown in FIGS. 2a, 2b and 2c which differ from the above-described single line arrangements in two respects. First, because in actual practice a single pulse line is impractical, a multi-line code is used as represented by lines $D_1$-$D_4$. This allows each displacement angle to be represented by a predetermined code combination. Thus, if a light source is used whose width in the direction in which the displacement is to be measured is equal to the width of one digit and whose length encompasses four lines and, if further, four phototransistors are used arranged in a single vertical line, the simultaneous read-out of all four phototransistors would result in a digital count for every angular position. The total actual digit count for the disk shown is fifteen and the resolution is the angular displacement represented by the width of one digit. The digit count may, of course, be extended by additional lines, depending upon the total angular rotation to be measured and the resolution requirements.

However, the above technique suffers from the drawback that it is virtually impossible to obtain a perfectly aligned array of phototransistors or a perfectly aligned light source. Any slight misalignment will, off course, produce ambiguity in the read-out if the angle that is measured is close to the line separating two digits. Further, of course, if the shaft rotates or oscillates by very small angular amounts around the digit separation line, a superimposed display may occur which may completely change the angular reading. For example, in the code display shown in FIG. 2, oscillation between the values of 7 and 8 may result in a read-out of 15.

To prevent the above-mentioned ambiguities and inaccuracies, in accordance with the present invention a control line marked K is added. This control line comprises a plurality of control markings each of which has a predetermined position relative to the code markings. It is the purpose of these code markings to furnish control signals after suitable processing, which control signals allow the data signals resulting from the read-out of the code markings to become effective only when the read-out means (photosensors) are in a predetermined position relative to the code markings, and more specifically are at the center of such code markings where the term "center," as previously mentioned, includes, but is not limited to, the geometric center. As will be described in detail below, the processing includes differentiation of the signals derived from the phototransistors consittuting control read-out means. The control signals derived by such differentiation, of course, occur substantially at the geometric center of each of the code markings for the embodiments shown in FIGS. 2a, 2b and 2c.

It will be noted that FIGS. 2a and 2b show embodiments of the code display means of the present invention used for measuring angular rotation and FIG. 2c shows an embodiment of the code display means for measuring of linear displacement, all three of the code display means having additional control lines which prevent ambiguity of the read-out mentioned above.

In the embodiments shown in FIGS. 2a, 2b and 2c, the read-out means for the control line and code line are assumed to be positioned in a straight line perpendicular to the direction in which displacement is to be measured. The control markings could of course be aligned with the code markings in the direction of displacement if the control read-out means were displaced half the width of a code marking from the code read-out means. For the purpose of the present invention, it is only important that the control pulse is furnished when the code read-out means are correctly positioned relative to the code markings.

Figure 4:
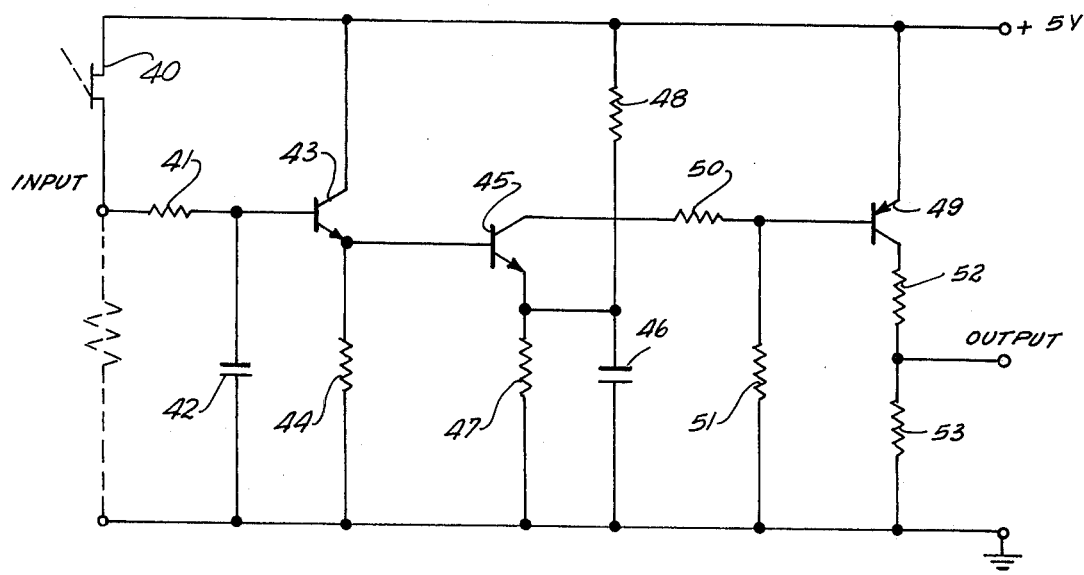
FIG. 4 is a schematic diagram of the code readout means of the present invention.

The overall system utilizing the code display means described above will now be discussed with reference to FIG. 3. Light and dark inputs are received at terminals $C_1$-$C_4$ in dependence on the code markings in lines $D_1$-$D_4$, respectively, of FIG. 2. The code read-out means each comprise a a phototransistor which forms the input to a circuit such as shown in FIG. 4. The output of each of the code read-out circuits is applied to the inverters labelled 21–24, respectively. The data signals appearing at the input and output of each of these inverters are applied to the J and K inputs of flip-flops 31–34, respectively. By applying a data signal (for example a "1") to the J input and its inverse ("0") simultaneously to the K input of any one flip-flop, a reliable setting of the flip-flop in accordance with the data signal is assured. The signals are transferred from the inputs of the flip-flops to the outputs (labelled $Q_1$-$Q_4$ in the Figure) only upon occurrence of a clock signal at the clock input, which is so labelled in the Figure. Thus, any signal which is applied at the input of each of the flip-flops remains at the input until receipt of the clock signal, at which time it is transferred to the output. It is stored at the output until receipt of the next subsequent clock signal.

Figure 5A:
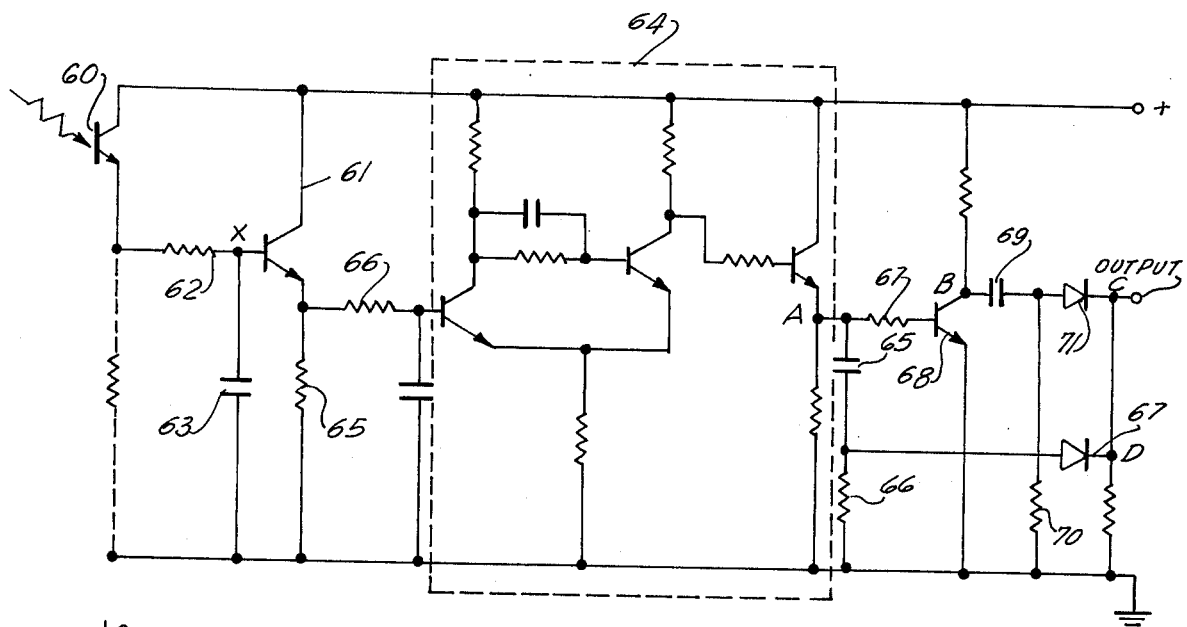
FIG. 5a is a schematic diagram of the control read-out means of the present invention.

In the simplest embodiment of the present invention the clock signal would be derived directly from the output of the control read-out circuitry. The control read-out circuitry is responsive to the light change generated by control line K as described above. Details of this circuitry are shown in FIG. 5A.

Figure 3:
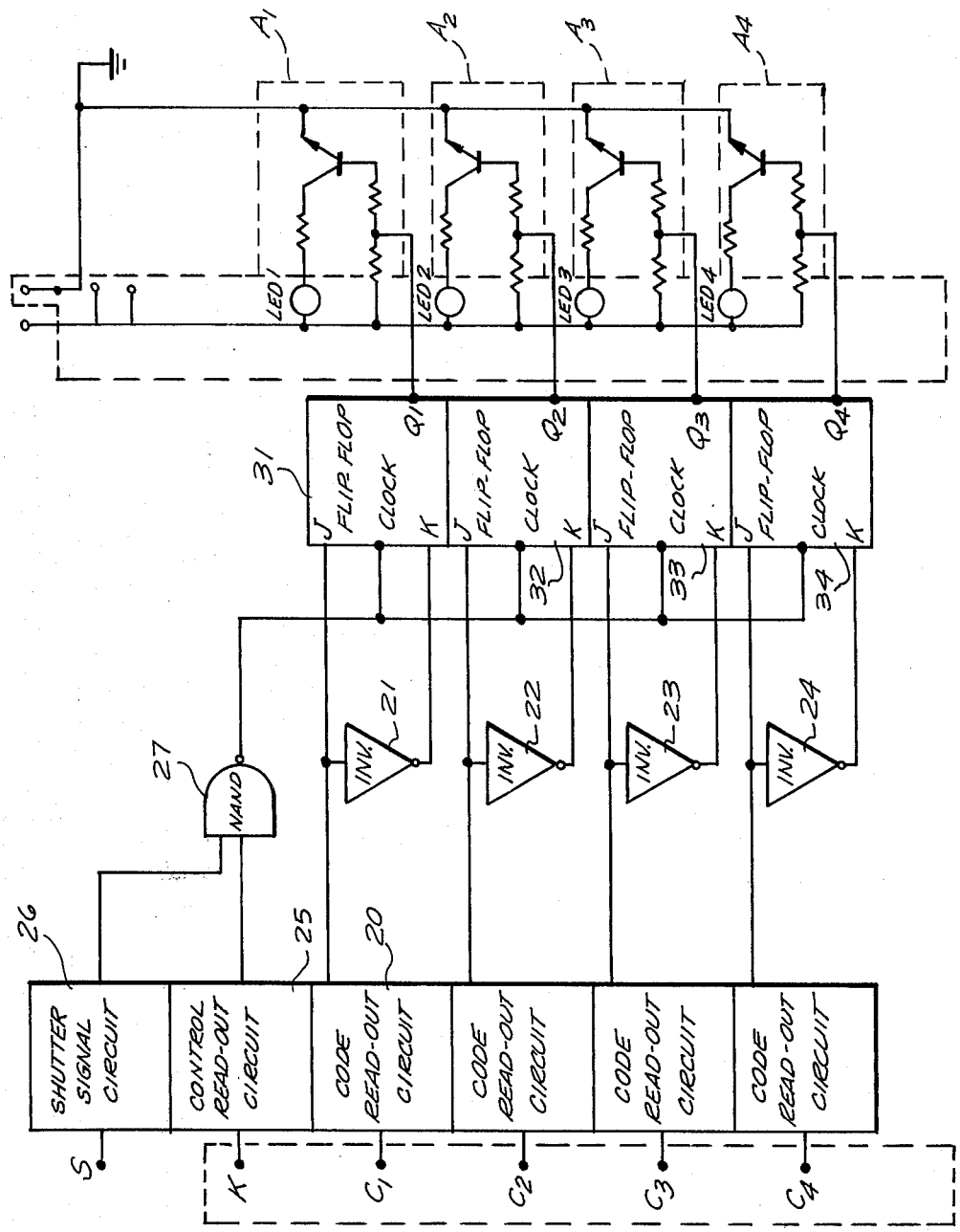
FIG. 3 shows a block diagram of the overall system of the present invention.

However, when the present invention is utilized in the arrangement for measuring camera tilt, and when it is desired to record the tilt angles at the instant of each exposure, further circuitry is required as shown in the block diagram of FIG. 3. Before this circuitry is discussed, it should be noted that in the aerial photography system in which this invention is to be utilized, the reference is provided by a conventional vertical gyroscope with two built-in optoelectronic sensing units 100 and 101. (See FIG. 6.) The gyroscope is compensated for drift and utilizes an electrical caging facility to rest the gyro. The sensing units are, of course, used for measuring and displaying the angles of forward and lateral tilt of the camera lens axis at the instant of exposure. Thus, two rigid structures are firmly attached to the gimbals of the gyroscope, on the longitudinal and lateral axes, respectively. Each holds a suitably mounted encoded mask specifically designed for opto-electrical read-out. These masks may, for example, be the masks shown in FIG. 2. Two code read-out units, each consisting of a series of light-emitting diodes constituting a light source and opposed by an equal number of phototransistors are mounted on the gyroscope main chassis and the longitudinal axis gimbal, respectively. A gap between the light sources and the corresponding phototransistors allow free movement of the code display as a function of aircraft attitude change. Thus, the code display means are rigidly related to the roll and pitch axes of the vertical gyroscope (constituting first elements) whereas the code read-out units are correspondingly related to the roll and pitch axes of the camera lens (second elements). Any change in the relative positions of the stable gyroscope axes and that of the camera lens induces a change in the data read-out. The use of the control read-out, of course, eliminates any ambiguity or overlap in the read-out as mentioned above.

It is desired that the output signals be recorded by the secondary optics of the camera. Thus, as shown in FIG. 3, a series of light-emitting diodes LED$_1$-LED$_4$ is energized through amplifiers A$_1$-A$_4$, respectively, by the output of flip-flops 31–34, respectively. The light-emitting diodes are suitably mounted into the data chamber of the camera. Also mounted within the camera is a cutout disk 118 fixed concentrically on one of the camera gears which is synchronized with the shutter. (See FIG. 7.) An opto-electronic sensor 119, for example such as described with reference to the code read-out means, is mounted to receive light through this cutout disk and furnishes a signal when the shutter is traveling across the field of the secondary optics. This signal, after suitable processing in the shutter signal circuit 26, described in more detail with reference to FIG. 7, forms one input to a NAND-gate 27 whose other input is furnished by control read-out circuit 25. The output signal of NAND-gate 27 constitutes the input to the clock inputs of flip-flops 31–34.

It is seen that by use of the gating means, namely NAND-gate 27, the signals at the outputs Q$_1$-Q$_4$ of flip-flops FF1-FF4 remain unchanged in the absence of the control signal and when the shutter is passing across the field of the secondary optics in the camera. Thus, the display recorded on the camera will not be subject to any ambiguity which might result if a change in read-out occurred during the shutter movement across the field of the secondary optics.

The code read-out, control read-out and shutter signal circuits will now be described in greater detail.

The code read-out circuit shown in FIG. 4 includes phototransistor 40, whose output is applied through an RC-filter comprising a resistor 41 and a capacitor 42 to the base of transistor 43. Transistor 43 is connected as an emitter-follower stage, the signal across its emitter resistor 44 being applied to the base of transistor 45. The emitter of transistor 45 is connected to ground potential through the parallel combination of capacitor 46 and resistor 47. It is further connected to the positive supply line through resistor 48. The collector of transistor 45 is connected to the base of transistor 49 through resistor 50. The base of transistor 49 is further connected to ground potential through resistor 51, while its emitter is directly connected to the positive line and its collector is connected to ground potential through a voltage divider comprising resistor 52 and resistor 53. The output of the reading circuit is taken from the common point of resistors 52 and 53.

The circuit operates as follows. Light falling on phototransistor 40 causes a rise in voltage at the base of transistor 43. This rise in voltage is transmitted to its emitter and therefore to the base of transistor 45. When transistor 45 becomes conductive, current can flow through the emitter-base circuit of transistor 49 causing this transistor to switch to the conductive state. Thus, a positive voltage will appear at the terminal marked "output" in FIG. 4.

The control read-out circuit is shown in FIG. 5a. This comprises a phototransistor 60 whose output is connected to the base of a transistor 61 through a filtering network comprising a resistor 62 and a capacitor 63. Transistor 61 is connected as an emitter-follower whose output controls the input to a Schmitt trigger 64. The output of Schmitt trigger 64 is differentiated by means of a differentiating circuit comprising a capacitor 55 and a resistor 66. Capacitor 65 is connected to the output of the Schmitt trigger, while one terminal of the resistor 66 is connected to ground potential. The other side of resistor 66 is connected through a diode 67 to an output terminal. The output voltage of Schmitt trigger 64 is further applied to the base of an inverting transistor 68. The voltage at the collector of transistor 68 is differentiated by means of a differentiating circuit comprising a capacitor 69 connected to the collector of transistor 68 and a resistor 70 connected between the other terminal of capacitor 69 and ground potential. The voltage at the common point of capacitor 69 and resistor 70 is applied to the output terminal mentioned above through a diode 71.

Figure 5B:
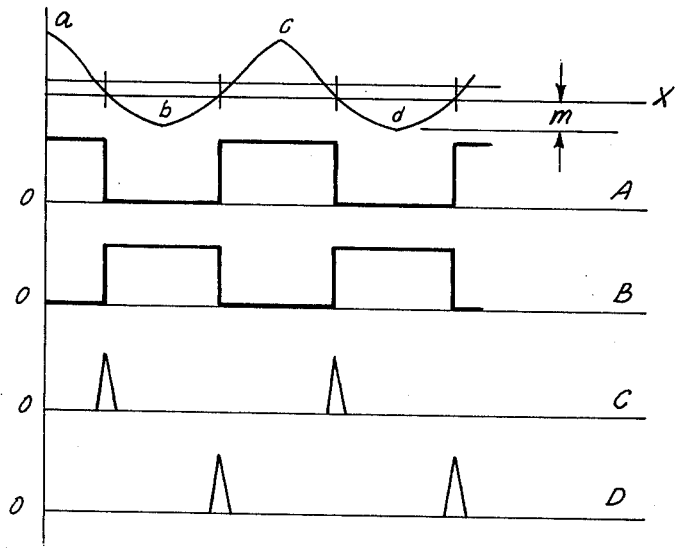

Schmitt trigger 64 shapes the signals supplied by phototransistor 50 into substantially rectangular signals as shown in line A of FIG. 5b. These rectangular signals are differentiated and the so-differentiated signals are applied through the above-mentioned diode 67 to the output terminal. While both the positive- and negative-going edges of the pulses of line A are differentiated, the negative pulses at the differentiation circuit output are suppressed by diode 67, so that only the positive pulses shown on line D appear at the output.

The inverted pulse sequence at the collector of transistor 68 (line B, FIG. 5b) is similarly differentiated, the resulting signal at the cathode of diode 71 being shown in line C of FIG. 5b. Of course, the signal at the output (FIG. 5a) comprises the signals of both lines C and D. Thus, the use of the inverting amplifier causes both the positive-going and the negative-going edges of the output of the Schmitt trigger to be differentiated and an output signal comprising a series of positive pulses, each signifying one edge of the output waveform of the Schmitt trigger 64 to be generated.

Figure 7:
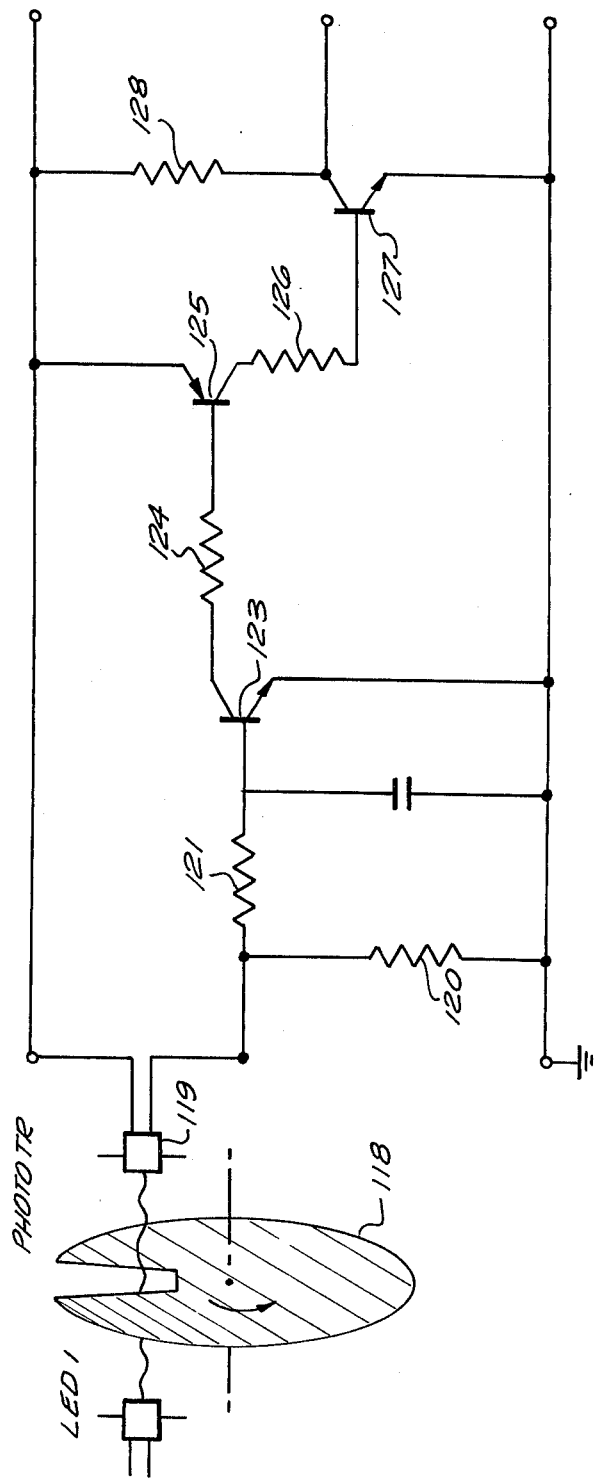
FIG. 7 shows the arrangement for furnishing the shutter signal utilized in FIG. 3.

FIG. 7 shows the arrangement used to furnish the shutter signal, that is an obturator disk 118 is shown passing between the light source LED1 and the phototransistor 119. As previously mentioned, disk 118 operates in synchronism with the shutter. Specifically, light from LED1 is permitted to impinge upon phototransistor 119 while an exposure takes place. Referring now to FIG. 7, light falling on phototransistor 119 causes the voltage at the base of transistor 123 to become more positive. This causes transistor 123 to become conductive, causing the voltage at the base of transistor 125 to become more negative, therefore causing transistor 125 to become conductive also. When transistor 125 becomes conductive, base-emitter current flows through transistor 127 causing this transistor to become conductive, thereby changing the voltage at its collector from a voltage substantially corresponding to the positive supply line voltage to substantially ground potential.

The signal at the output of the collector of transistor 127 is the signal appearing at the output of the "shutter signal circuit" of FIG. 3. As long as the voltage at the collector of transistor 127 is high, any signals from the control read-out circuit 25 appearing at the second input of NAND-gate 27 are transmitted through NAND-gate 27, since NAND-gate 27 is then conductive. When the voltage at the collector of transistor 127 goes negative, NAND-gate 27 is blocked, thereby preventing any signals from the control read-out circuit 25 from reaching the clock input of flip-flops 31–34. Thus, no change in the read-out can occur while the shutter of the camera is open.

Figure 8:
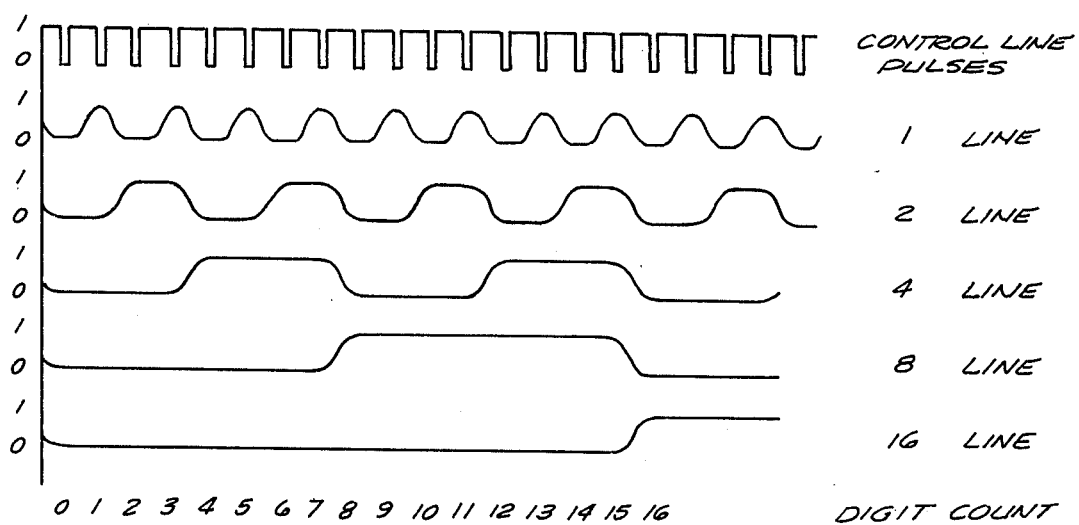
FIG. 8 shows the pulse sequences generated by the code and control read-out means.

FIG. 8 shows the signals generated at the outputs of the shutter signal and read-out circuits. Specifically, the line labeled "Control Line Pulses" shows the output of the control read-out circuits, while the lines labeled 1, 2, 4, and 8 constitute the signals at the outputs of inverters 21–24 of FIG. 3.

Figure 6:
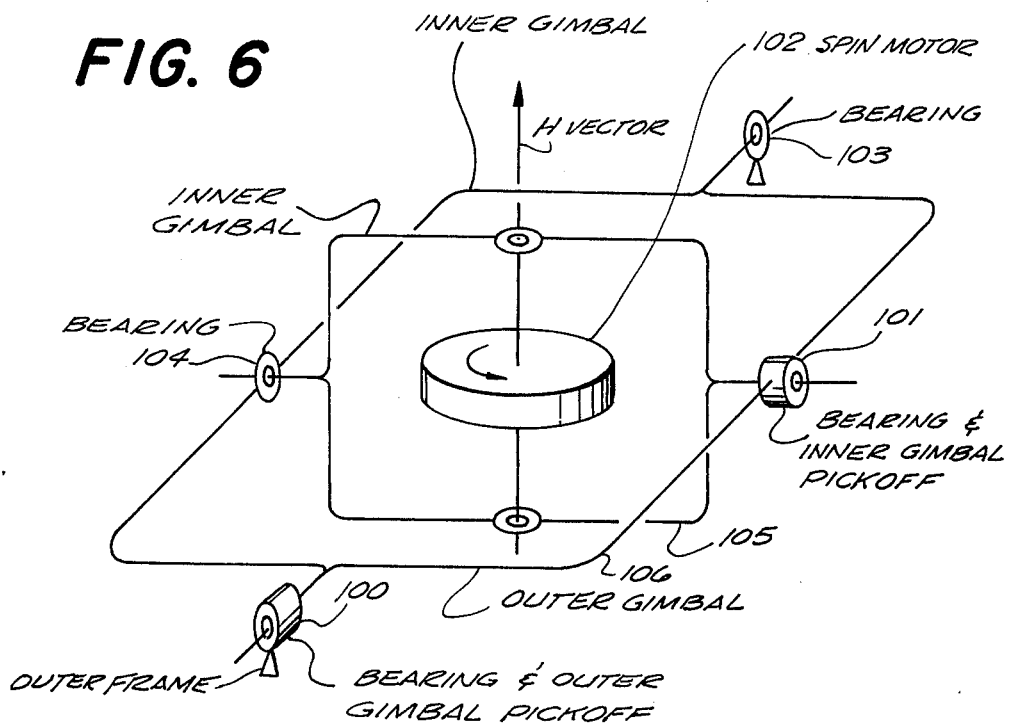
FIG. 6 is a schematic diagram showing a gyroscope with digital tilt angle pickoffs.

Finally, FIG. 6 will be described in greater detail in relation to a system wherein it is desired to display the aircraft roll and pitch angles to the pilot. A gyroscope is used to measure the pitch and roll angles of the aircraft. The gyroscope has a spin motor 102 whose axis of rotation is indicated by "H vector". The inner gimbal 105 rotates within bearings 101 and 104. Rigidly connected to the outside of bearings 101 and 104 is the outer gimbal 106 which, in turn, rotates within bearings 100 and 103. Code signals signifying the pitch and roll angles, respectively, and the control signals which, as previously explained, assure that the read-out takes place only when the read-out means are in a predetermined position relative to the code markings, may be derived from the inner and outer gimbal pickoffs, respectively. The so-furnished signals from the inner gimbal pickoff are applied to inputs K and C1, C2, C3 and C4 of FIG. 3. Since it is desired merely to furnish an indication of the pitch angle to the pilot, NAND-gate 27 is eliminated, the output of control circuit 25 is directly connected to the clock input of flip-flops processed. and the indications read on the light-emitting diodes LED1-LED4 serve as an indication of the pitch angle. The pickoffs from the outer gimbal is, of course, similarly processed. Thus, pitch and roll angles are indicated to the pilot.

While the preferred embodiment of the invention has been described as utilizing a photoelectric read-out, other types of read-outs such as magnetic and electromechanical read-outs may also be used. The main distinguishing feature of the present invention is the use of the control markings which prevent the ambiguity in the digital read-out.

While the invention has been illustrated and described as embodied in a specific sensing and processing arrangement for the data and control markings, it is not intended to be limited to the details shown, since various modifications and structural changes may be made without departing in any way from the spirit or basic concept of the present invention.

Without further analysis, the foregoing will so fully reveal the gist of the present invention that others can by applying current knowledge readily adapt it for various applications without omitting features that from the standpoint of prior art fairly constitute essential characteristics of the generic or specific aspects of the present invention and, therefore, such modifications and adaptations should and are intended to be comprehended within the meaning and range of equivalence of the following claims.

What is claimed as new and desired to be protected by letters patent is set forth in the appended claims:

1. Displacement measuring apparatus for measuring displacement in a predetermined direction of a first element relative to a second element, comprising, in combination, code display means coupled to said first element, said code display means having a plurality of digital code markings each representing a predetermined unit of displacement spaced at predetermined distances from each other in said predetermined direction, said code display means further having control markings arranged in predetermined positions relative to said code markings; read-out means coupled to said second element and comprising code read-out means and control read-out means mounted in predetermined positions relative to each other, for respectively reading out code markings and control markings passing in operative proximity thereto and furnishing corresponding data and control signals; means for providing said control signals only when said code readout means are positioned relative to the central portion of said code markings; output circuit means connected to said read-out means for furnishing output signals corresponding to said data signals only upon receipt of said control signal and for storing said output signals until receipt of the next-subsequent one of said control signals thereby furnishing stored output signals; a plurality of light sources connected to said output circuit means for energization by said stored output signals; camera means for photographing said light sources, said camera means having a shutter and secondary optics for recording said light from said light sources; means for furnishing a shutter signal when said shutter is travelling across said secondary optics; and gating means interconnected between said means for furnishing a shutter signal, said control read-out means, and said output circuit means for furnishing said control signals to said output circuit means only in the presence of said control signals and the absence of said shutter signals.

2. An apparatus as set forth in claim 1, wherein each of said code markings has a predetermined width extending in said predetermined direction and a predetermined central portion within said width wherein read-out is unambiguous; and wherein said control markings are positioned relative to said code markings in such a manner that said output signals are furnished only when said predetermined positions of said read-out means relative to said code markings are within said predetermined central portion.

3. An apparatus as set forth in claim 2, wherein said code read-out means are aligned with said control read-out means in a direction perpendicular to said predetermined direction; and wherein said code markings are displaced a predetermined distance from said control markings in said predetermined direction.

4. An apparatus as set forth in claim 2, wherein said code markings are aligned with said control markings in a direction perpendicular to said predetermined direction; and wherein said control read-out means are displaced a predetermined distance relative to said code read-out means in said predetermined direction.

5. An apparatus as set forth in claim 1, wherein each of said code markings has a predetermined width extending in said predetermined direction; and wherein said control markings are positioned relative to said code markings in such a manner that said control signals are furnished only when said read-out means is substantially at the geometric center of said code markings in said predetermined direction.

6. An apparatus as set forth in claim 2, wherein each of said predetermined units of displacement is further represented by a second plurality of code markings arranged in a direction perpendicular to said predetermined direction; and wherein said code read-out means comprise a plurality of code read-out means corresponding in number to said second plurality of code markings and arranged in a direction perpendicular to said predetermined directions.

7. An apparatus as set forth in claim 2, wherein each of said control markings has a leading edge positioned for indicating a predetermined position within said predetermined central portion of a corresponding one of said code markings; and wherein said control read-out means comprise differentiating circuit means for furnishing said control signals in response to said leading edges.

8. Apparatus as set forth in claim 2, wherein each of said control markings has a width in said predetermined direction corresponding to said width of said code markings, whereby each of said control markings has a trailing edge for indicating the corresponding predetermined position of the next subsequent one of said code markings; and wherein said differentiating circuit means furnish said control signals in response to said leading edges and said trailing edges of said code markings.

9. Apparatus as set forth in claim 8, wherein said read-out means comprise photoelectric read-out means; and wherein said code markings and said control markings comprise light-transmissive slots.

10. Apparatus as defined in claim 1, wherein said output circuit means comprise a plurality of flip-flops each having a data input connected to a corresponding one of said code read-out means, a clock input connected to said control read-out means and an output connected to said clock and data inputs in such a manner that said output changes state only upon simultaneous receipt of a signal at said data and clock inputs.

11. Apparatus as set forth in claim 10, wherein said plurality of light sources comprise a plurality of light sources each connected to a corresponding one of said flip-flop outputs.

12. Apparatus as set forth in claim 11, wherein each of said light sources is a light-emitting diode.

13. Apparatus as defined in claim 1, wherein said gating means comprise a NAND-gate having a first input connected to the output of said control read-out means, a second input connected to said means for furnishing a shutter signal and an output connected to said clock inputs of said flip-flops.

14. Apparatus as set forth in claim 1, wherein said control read-out means comprise transducer means for sensing said control markings and furnishing corresponding electrical control signals; Schmitt trigger means connected to said transducer means for shaping said electrical control signals into substantially rectangular signals; and differentiator circuit means for differentiating said substantially rectangular signals, said so-differentiated signals constituting said control signals.

15. Apparatus as set forth in claim 14, further comprising inverter means connected to the output of said Schmitt trigger means; and wherein said differentiator circuit means comprise first differentiator circuit means connected to said Schmitt trigger means, first diode means connected to the output of said first differentiator circuit means, second differentiator circuit means connected to the output of said inverter means, second diode means connected to the output of said second differentiator circuit means, and means directly connecting the output of said first diode means to the output of said second diode means.

* * * * *